(12) United States Patent
Kim et al.

(10) Patent No.: US 11,881,243 B2
(45) Date of Patent: Jan. 23, 2024

(54) SEMICONDUCTOR DEVICE INCLUDING A MEMORY ARRAY PERFORMING A MULTIPLICATION AND ACCUMULATION (MAC) OPERATION USING CAPACITORS

(71) Applicants: SK hynix Inc., Icheon (KR); Korea Advanced Institute of Science and Technology, Daejeon (KR)

(72) Inventors: Kyunghyun Kim, Daejeon (KR); Jino Seo, Uiwang (KR); Hyukjin Lee, Suwon (KR); SeongHwan Cho, Daejeon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 187 days.

(21) Appl. No.: 17/524,447

(22) Filed: Nov. 11, 2021

(65) Prior Publication Data
US 2022/0336001 A1 Oct. 20, 2022

(30) Foreign Application Priority Data
Apr. 14, 2021 (KR) .................. 10-2021-0048133

(51) Int. Cl.
| | |
|---|---|
| *G11C 11/40* | (2006.01) |
| *G06F 7/544* | (2006.01) |
| *H03M 1/74* | (2006.01) |
| *G06F 7/50* | (2006.01) |
| *G06F 7/523* | (2006.01) |

(52) U.S. Cl.
CPC ............ *G11C 11/40* (2013.01); *G06F 7/50* (2013.01); *G06F 7/523* (2013.01); *G06F 7/5443* (2013.01); *H03M 1/74* (2013.01)

(58) Field of Classification Search
None
See application file for complete search history.

(56) References Cited

U.S. PATENT DOCUMENTS

| | | | | |
|---|---|---|---|---|
| 5,014,235 A | * | 5/1991 | Morton ................. | G06F 17/16 365/185.11 |
| 10,877,752 B2 | | 12/2020 | Chen et al. | |
| 11,018,687 B1 | * | 5/2021 | Srivastava ............. | G11C 11/54 |

(Continued)

OTHER PUBLICATIONS

S. Yin et al., "XNOR-SRAM: In-Memory Computing SRAM Macro for Binary/Ternary Deep Neural Networks," in IEEE Journal of Solid-State Circuits, vol. 55, No. 6, pp. 1733-1743, Jun. 2020, doi: 10.1109/JSSC.2019.2963616.

(Continued)

*Primary Examiner* — J. H. Hur

(57) ABSTRACT

A semiconductor device includes a memory cell array including a plurality of memory cells coupled between a multiplicity of word lines and one or more bit lines; and an operation circuit configured to perform a multiplication and accumulation (MAC) operation with one or more first multi-bit data provided from the one or more bit lines and one or more second multi-bit data, wherein a plurality of memory cells coupled to a bit line store a plurality of bits included in a corresponding one of the one or more first multi-bit data, and wherein the memory cell array sequentially provides the plurality of bits included in the corresponding first multi-bit data to the operation circuit.

9 Claims, 7 Drawing Sheets

(56) References Cited

U.S. PATENT DOCUMENTS

| | | | |
|---|---|---|---|
| 2015/0279466 A1* | 10/2015 | Manning | G11C 7/1006 |
| | | | 365/49.17 |
| 2017/0220526 A1* | 8/2017 | Buchanan | G06F 7/523 |
| 2018/0095748 A1* | 4/2018 | Buchanan | G06F 7/5443 |
| 2019/0042199 A1 | 2/2019 | Sumbul et al. | |
| 2019/0102170 A1* | 4/2019 | Chen | G11C 7/16 |
| 2019/0205095 A1* | 7/2019 | Gupta | G06F 7/607 |
| 2021/0005230 A1* | 1/2021 | Wang | G11C 7/106 |
| 2021/0072986 A1* | 3/2021 | Yudanov | G11C 7/1006 |

OTHER PUBLICATIONS

A. Biswas et al., "CONV-SRAM: An Energy-Efficient SRAM With In-Memory Dot-Product Computation for Low-Power Convolutional Neural Networks," in IEEE Journal of Solid-State Circuits, vol. 54, No. 1, pp. 217-230, Jan. 2019, doi: 10.1109/JSSC.2018.2880918.

* cited by examiner

SEMICONDUCTOR DEVICE INCLUDING A MEMORY ARRAY PERFORMING A MULTIPLICATION AND ACCUMULATION (MAC) OPERATION USING CAPACITORS

CROSS-REFERENCE TO RELATED APPLICATION

The present application claims priority under 35 U.S.C. § 119(a) to Korean Patent Application No. 10-2021-0048133, filed on Apr. 14, 2021, which is incorporated herein by reference in its entirety.

BACKGROUND

1. Technical Field

Various embodiments generally relate to a semiconductor device performing a multiplication and accumulation (MAC) operation.

2. Related Art

Neural networks are widely used in artificial intelligence fields such as image recognition and self-driving cars.

A value of a neuron included in an input layer is determined from an input value, and a value of a neuron included in an inner layer and an output layer is obtained from a calculation result using values of neurons included in a previous layer and weights assigned to synapses.

As described above, in a neural network operation, multiplication and accumulation (MAC) operations are frequently performed using values of neurons and weights of synapses, and the importance of an operation circuit capable of efficiently performing these operations is increasing.

A conventional in-memory MAC operation device has a structure that greatly deforms the existing memory structure, and thus there is a problem in that the existing memory performance is deteriorated and an area occupied by the device or power consumption of the device is increased.

In addition, the conventional in-memory MAC operation device does not use multi-bit data or weights, but is limited to a structure using 1-bit data or weights, so there is a limit in terms of data accuracy.

SUMMARY

In accordance with an embodiment of the present disclosure, a semiconductor device may include a memory cell array including a multiplicity of memory cells coupled between a plurality of word lines and one or more bit lines; and an operation circuit configured to perform a multiplication and accumulation (MAC) operation with one or more first multi-bit data provided from the one or more bit lines and one or more second multi-bit data, wherein a plurality of memory cells coupled to a bit line store a plurality of bits included in a corresponding one of the one or more first multi-bit data, and wherein the memory cell array sequentially provides the plurality of bits included in the corresponding first multi-bit data to the operation circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
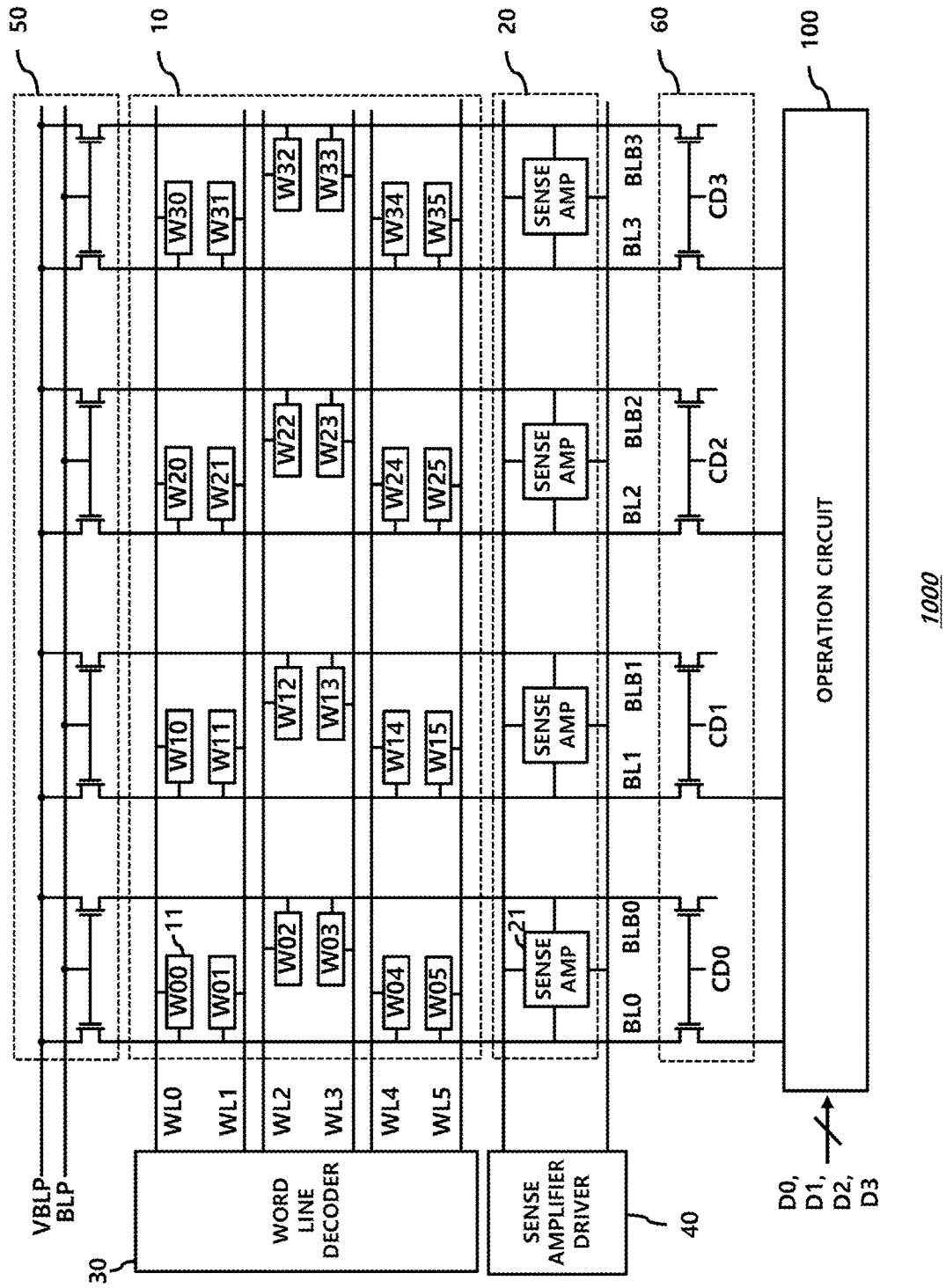
FIG. 1 illustrates a semiconductor device according to an embodiment of the present disclosure.

FIG. 1 illustrates a semiconductor device 1000 according to an embodiment of the present disclosure.

The semiconductor device 1000 includes a memory cell array 10, a sense amplifier array 20, a word line decoder 30, a sense amplifier driver 40, a bit line precharge circuit 50, and a bit line coupling circuit 60, and an operation circuit 100.

The memory cell array 10 includes a plurality of word lines, e.g., WL0 to WL5, a plurality of bit lines, e.g., BL0 to BL3, a plurality of dummy bit lines, e.g., BLB0 to BLB3, and a plurality of memory cells 11 coupled between the plurality of word lines WL0 to WL5 and the plurality of bit lines and dummy bit lines BL0 to BL3 and BLB0 to BLB3.

A memory cell 11 may be a volatile memory cell such as a Dynamic Random Access Memory (DRAM) cell or a Static Random Access Memory (SRAM) cell, or a nonvolatile memory cell such as a flash memory cell or a resistive memory cell, but is not limited to a specific type.

In an embodiment, it is assumed that the memory cell 11 is a DRAM cell and the memory cell 11 stores one bit of a multi-bit weight.

For example, six memory cells coupled to the 0th bit line BL0 and the 0th dummy bit line BLB0 sequentially store six bits W00 to W05 of a 0th weight W0.

More specifically, the memory cell coupled to the 0th word line WL0 stores the 0th bit W00 of the 0th weight W0, and the memory cell coupled to the 5th word line WL5 stores the 5th bit W05 of the 0th weight W0.

The sense amplifier array 20 includes a plurality of sense amplifiers (AMP) 21 for determining data of memory cells by amplifying signals of the plurality of bit lines BL0 to BL3 and the plurality of dummy bit lines BLB0 to BLB3.

The word line decoder 30 controls the plurality of word lines WL0 to WL5, and the sense amplifier driver 40 controls the plurality of sense amplifiers 21.

Since the configuration and operation of the memory cell array 10, the sense amplifier array 20, the word line decoder 30, and the sense amplifier driver 40 are well known from a conventional semiconductor device, a detailed description thereof will be omitted.

The bit line precharge circuit 50 precharges a bit line and a dummy bit line with a precharge voltage VBLP according to a bit line precharge signal BLP.

The bit line coupling circuit 60 couples the plurality of bit lines BL0 to BL3 with the operation circuit 100 according to bit line coupling signals CD0 to CD3, respectively.

Accordingly, a weight may be provided to the operation circuit 100 through a corresponding bit line.

The operation circuit 100 performs a multiplication and accumulation (MAC) operations using input data D0 to D3 and weights W0 to W3.

In this embodiment, each of the input data D0 to D3 and the weights W0 to W3 are a multi-bit digital signal.

Hereinafter, a weight may be referred to as first multi-bit data, and input data may be referred to as second multi-bit data.

Figure 2:
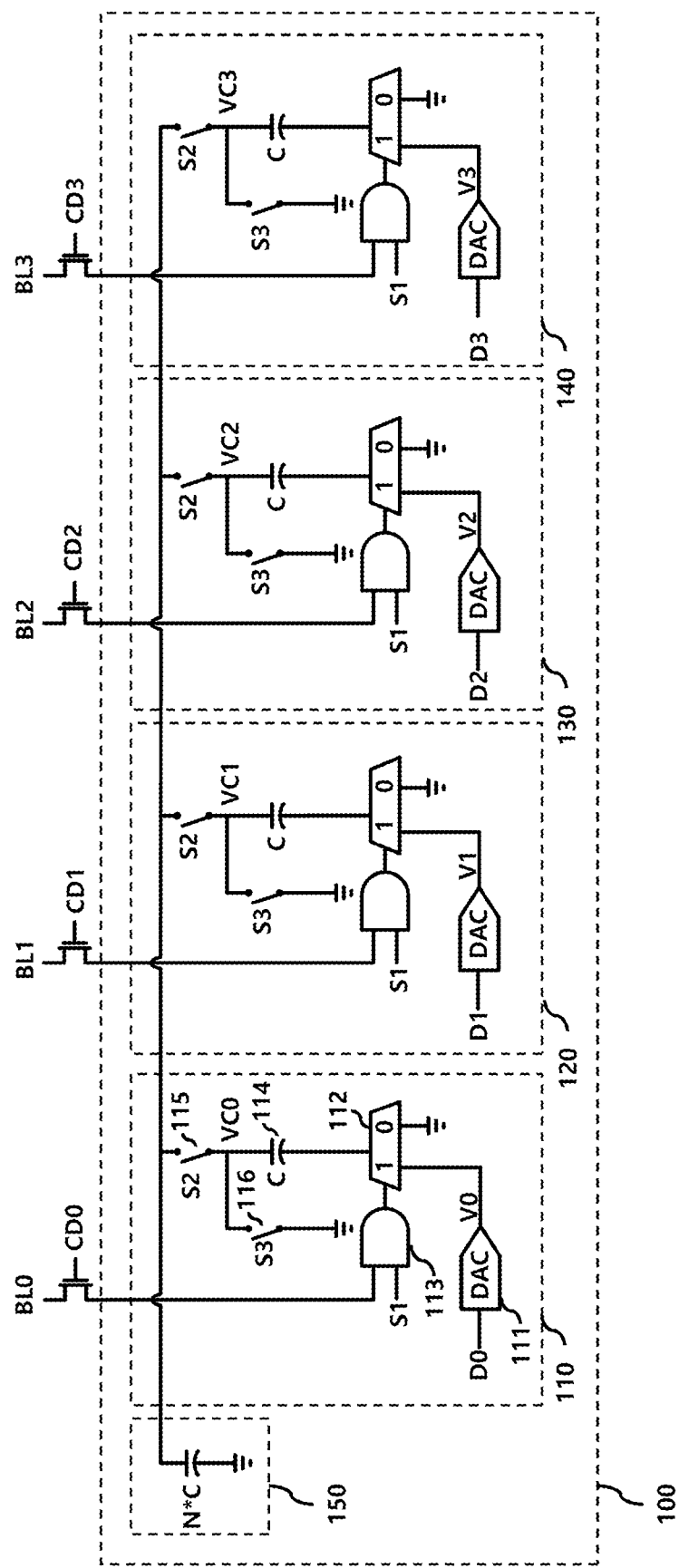
FIGS. 2 and 3 illustrate operation circuits according to an embodiment of the present disclosure.

FIG. 2 illustrates a circuit diagram of the operation circuit 100 shown in FIG. 1 according to an embodiment of the present disclosure.

The operation circuit 100 includes a plurality of unit operation circuits, e.g., 110, 120, 130, and 140, and an accumulation capacitor 150 coupled to the plurality of unit operation circuits, e.g., 110, 120, 130, and 140.

In an embodiment, capacitance of the accumulation capacitor 150 is N*C, where N corresponds to the number of unit operation circuits coupled to the accumulation capacitor 150 and C corresponds to capacitance of a unit capacitor included in each unit operation circuit. In this embodiment shown in FIG. 2, N is 4.

The unit operation circuit 110 includes a digital-to-analog converter (DAC) 111, a selection circuit 112, a logic circuit 113, a unit capacitor 114, a first switch 115, and a second switch 116. The DAC 111 converts the input data D0 into an input voltage V0. The selection circuit 112 selects and outputs one of the input voltage V0 and a ground voltage according to a selection signal. The logic circuit 113 generates the selection signal by performing a logical operation on a corresponding bit line signal and a first switching signal S1. The unit capacitor 114 has a first terminal coupled to an output terminal of the selection circuit 112. The first switch 115 couples a second terminal of the unit capacitor 114 with the accumulation capacitor 150 according to a second switching signal S2. The second switch 116 couples the second terminal of the unit capacitor 114 to the ground according to a third switching signal S3.

Since the plurality of unit operation circuits 110, 120, 130, and 140 have substantially the same configuration, a repeated description therefor will be omitted.

In the embodiment of FIG. 2, the operation circuit 100 includes one accumulation capacitor 150 having capacitance of 4C.

In another embodiment, the operation circuit 100 may include four unit accumulation capacitors coupled in parallel, each of the four unit accumulation capacitors having capacitance of C. In this case, the four unit accumulation capacitors may be included in the four unit operation circuits 110, 120, 130, and 140, respectively.

Figure 3:
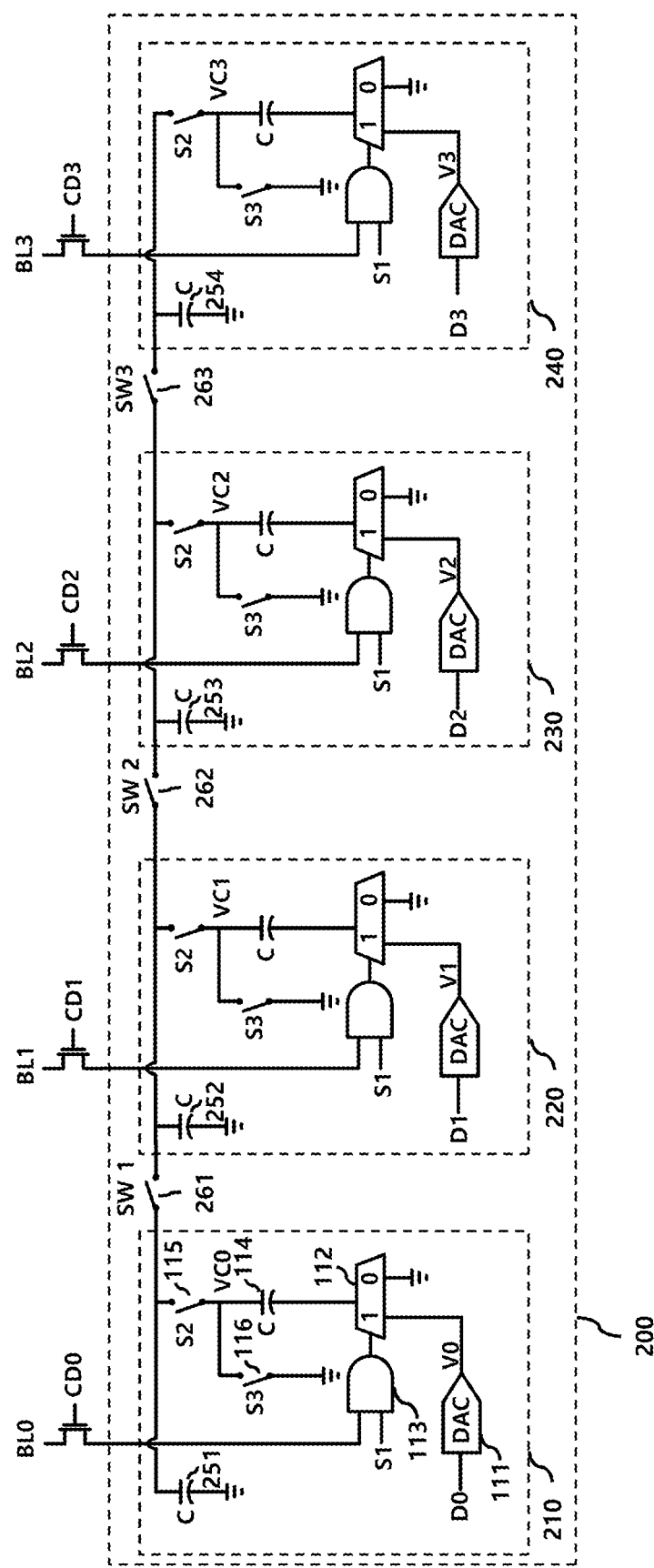

FIG. 3 illustrates a circuit diagram of an operation circuit 200 according to an embodiment of the present disclosure.

The operation circuit 200 of FIG. 3 is different from the operation circuit 100 of FIG. 2 in that one accumulation capacitor 150 of FIG. 2 is divided into a plurality of unit accumulation capacitors, e.g., 251, 252, 253, and 254, coupled in parallel and allocated to a plurality of unit operation circuits, e.g., 210, 220, 230, and 240, respectively.

For example, the unit operation circuit 210 of FIG. 3 is different from the unit operation circuit 110 of FIG. 2 in that the unit accumulation capacitor 251 is included therein.

Since the plurality of unit operation circuits 210, 220, 230, and 240 have substantially the same configuration, repeated descriptions therefor will be omitted.

The operation circuit 200 further includes a plurality of coupling switches, e.g., 261, 262, and 263.

For example, the coupling switch 261 couples adjacent unit operation circuits 210 and 220 according to a coupling switching signal SW1.

More specifically, for example, when the coupling switching signal SW1 is at a logic high level, the coupling switch 261 is turned on, and accordingly, the unit accumulation capacitor 251 included in the unit operation circuit 210 and the unit accumulation capacitor 252 included in the unit operation circuit 220 is coupled in parallel to each other.

In the embodiment of FIG. 2, the four unit operation circuits 110, 120, 130, and 140 are together used to perform one MAC operation.

In contrast, in the embodiment of FIG. 3, the plurality of unit operation circuits 210, 220, 230, and 240 may be separated from each other or selectively coupled to each other according to a combination of coupling switching signals SW1, SW2, and SW3 in order to perform one or more MAC operations.

Figure 4:
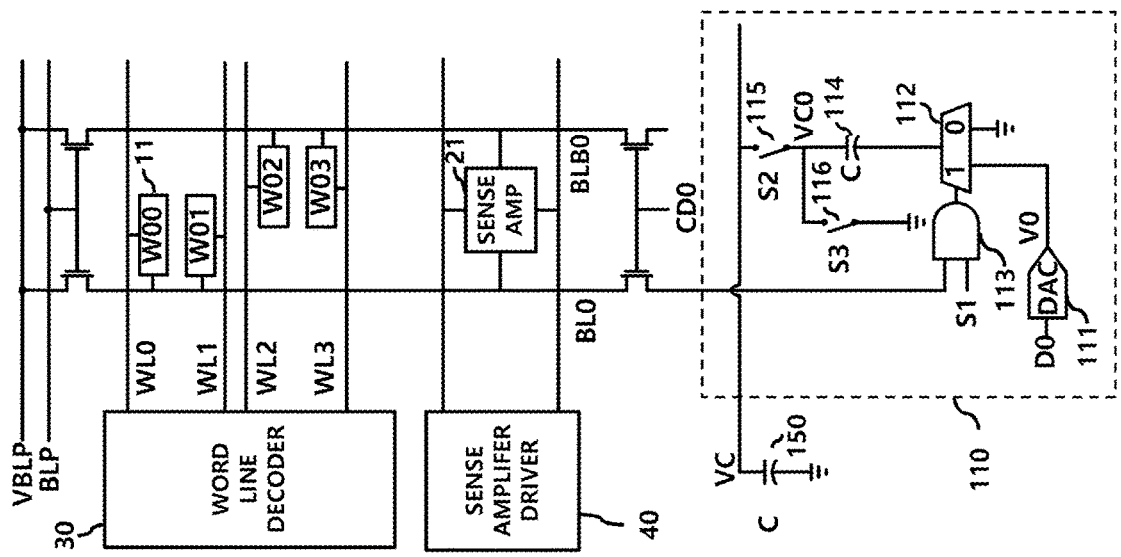
FIG. 4 illustrates a semiconductor device according to an embodiment of the present disclosure.

FIG. 4 illustrates a semiconductor device according to an embodiment of the present disclosure.

An MAC operation between input data D0 and a weight W0 including four weight bits W00, W01, W02, and W03 will be described with reference to FIG. 4. The four weight bits W00, W01, W02, and W03 are stored in memory cells coupled to a bit line BL0 and a dummy bit line BLB0.

Figure 5:
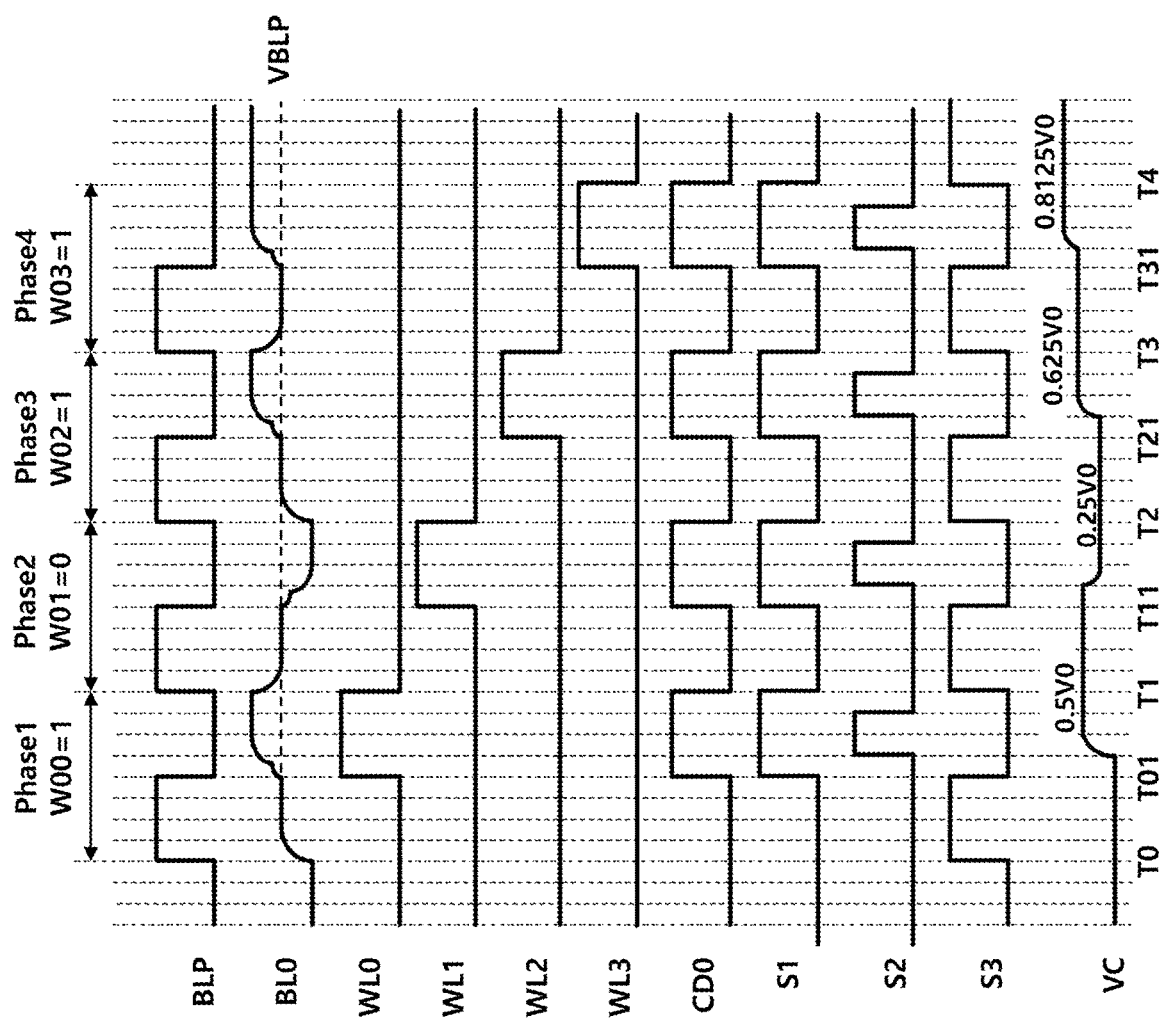
FIG. 5 is a timing diagram illustrating an operation of the semiconductor device shown in FIG. 4 according to an embodiment of the present disclosure.

FIG. 5 is a timing diagram illustrating an operation of the semiconductor device illustrated in FIG. 4.

In this operation, it is assumed that the weight bits W03, W02, W01, and W00 of the weight W0 are "1101" and an input voltage corresponding to the input data D0 is V0.

During a phase 1 operation between T0 and T1, the product of the least significant bit W00, which is '1,' and the input voltage V0 is calculated.

Between T0 and T01, a bit line precharge signal BLP is activated, so that a voltage of the bit line BL0 is precharged to the precharge voltage VBLP.

At this time, the first switching signal S1 is deactivated to a logic low level, and the third switching signal S3 is activated.

Accordingly, an output of the logic circuit 113 becomes a logic low level and the switch 116 is turned on, so that both terminals of the unit capacitor 114 are grounded and the unit capacitor 114 is discharged.

Between T01 and T1, the bit line precharge signal BLP is deactivated and the word line signal WL0 is activated to select the memory cell 11. At this time, the bit line coupling signal CD0 is activated to couple the bit line BL0 to the operation circuit 100.

The voltage of the bit line BL0 temporarily rises due to charge distribution, and is then amplified to a power supply voltage VDD by an operation of the sense amplifier 21.

At this time, the first switching signal S1 is activated, and the third switching signal S3 is deactivated.

Accordingly, the output of the logic circuit 113 becomes the logic high level, and the input voltage V0 is applied to the first terminal of the unit capacitor 114, and the second terminal of the capacitor 114 is coupled to the switch 115.

In this section, before the second switching signal S2 is activated, a voltage across the unit capacitor 114 is set as the input voltage V0 according to the voltage of the bit line BL0.

Thereafter, the second switching signal S2 becomes the logic high level.

During this period of T01 to T1, the switch 115 is turned on, and accordingly, charges are redistributed between the unit capacitor 114 and the accumulation capacitor 150, and the voltage VC of the accumulation capacitor 150 rises to 0.5*V0 (or 0.5 V0).

A phase 2 operation is performed between T1 and T2, a phase 3 operation is performed between T2 and T3, and a phase 4 operation is performed between T3 and T4.

The operation in each phase is substantially the same as the operation of the phase 1 operation except that a level of the voltage output through the bit line BL0 varies according to a selected word line.

During the phase 2 operation, the word line WL1 is selected and the weight bit W01, e.g., 0V, which corresponds to '0,' is outputted through the bit line BL0.

Accordingly, when the phase 2 operation is finished, the charging voltage VC of the accumulation capacitor 150 becomes 0.25 V0 due to charge redistribution.

During the phase 3 operation, the word line WL2 is selected and the weight bit W02, e.g., the power supply voltage VDD, which corresponds to '1,' is output through the bit line BL0.

Accordingly, when the phase 3 operation is finished, the charging voltage VC of the accumulation capacitor 150 becomes 0.625 V0 due to charge redistribution.

During the phase 4 operation, the word line WL3 is selected and the weight bit W03, e.g., the power supply voltage VDD, which corresponds to '1,' is output through the bit line BL0.

Accordingly, when the phase 4 operation is finished, the charging voltage VC of the accumulation capacitor 150 becomes 0.8125 V0 due to charge redistribution.

After the phase 4 operation is finished, the final voltage VC of the accumulation capacitor 150 corresponds to the product of the weight W0 and the input data D0.

When the number of word lines is M, that is, when the weight W0 includes M bits, e.g., W00 to W0(M−1), the charging voltage VC of the accumulation capacitor 150 may be expressed as Equation 1, where M is a natural number.

$$VC = \sum_{i=0}^{M-1} \frac{W0i}{2^{M-i}} V0 \qquad \text{(Equation 1)}$$
$$= \frac{V0}{2^M} \sum_{i=0}^{M-1} W0i \times 2^i$$
$$= \frac{1}{2^M} W0 \times V0$$

As shown in Equation 1, by repeating the above phase operation M times, the output voltage VC of the accumulation capacitor 150 is obtained by multiplying the product of the weight W0 and the input voltage V0 by a constant $2^{-M}$.

Figure 6:
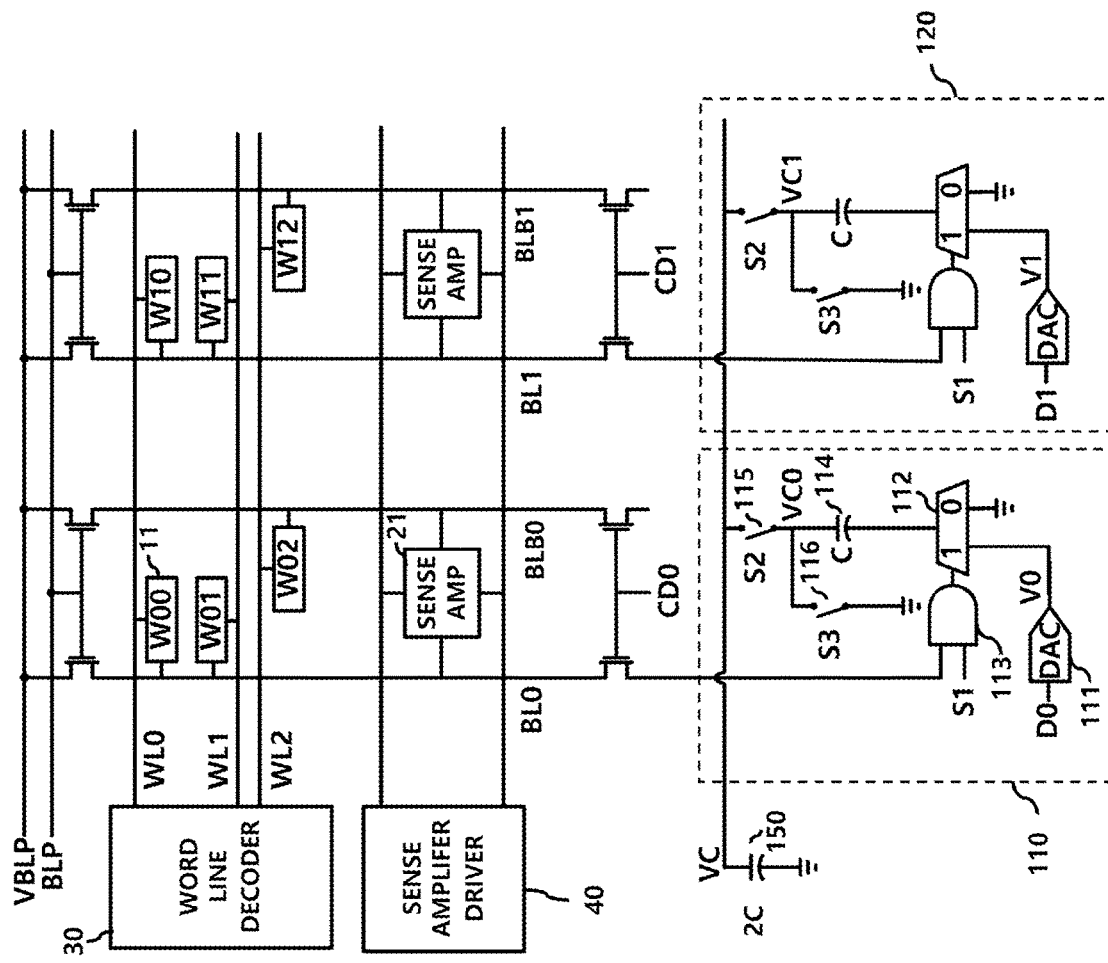
FIG. 6 illustrates a semiconductor device according to an embodiment of the present disclosure.

FIG. 6 illustrates a semiconductor device according to an embodiment of the present disclosure.

In FIG. 6, it is assumed that a weight is a vector including two elements W0 and W1, each of which is 3-bit data. For example, the element W0 includes W00, W01, and W02, and the element W1 includes W10, W11, and W12.

Hereinafter, the element W0 may be referred to as a first weight, and the element W1 may be referred to as a second weight.

Also, input data is a vector having two elements D0 and D1. Hereinafter, the element D0 may be referred to as first input data, the element D1 may be referred to as second input data. In this case, it is assumed that an input voltage V0 corresponds to the first input data D0, and an input voltage V1 corresponds to the second input data D1.

Hereinafter, the input voltage V0 may be referred to as a first input voltage, and the input voltage V1 may be referred to as a second input voltage.

Figure 7:
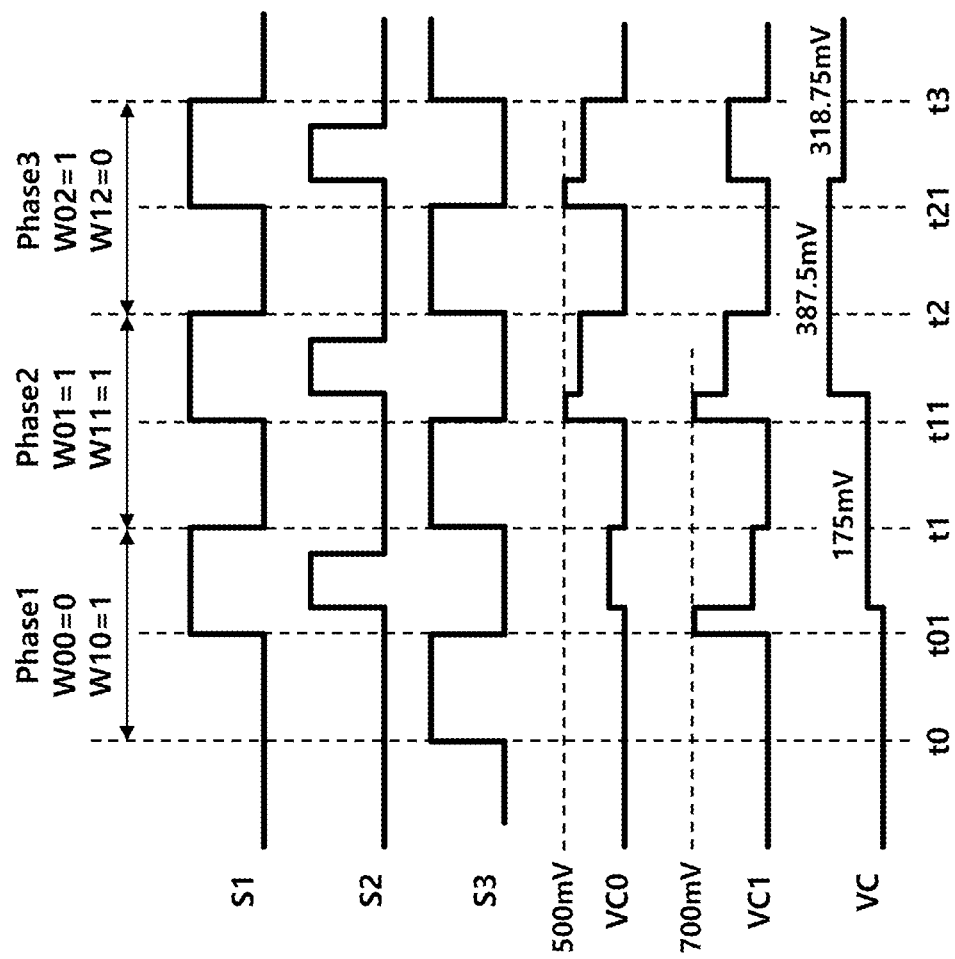
FIG. 7 is a timing diagram illustrating an operation of the semiconductor device shown in FIG. 6 according to an embodiment of the present disclosure.

FIG. 7 is a timing diagram illustrating an operation of the semiconductor device illustrated in FIG. 6.

Although the bit line precharge signal BLP, the bit line voltages BL0 and BL1, and the word line voltage WL0, WL1, and WL2 are omitted from the timing diagram of FIG. 7, this can be easily seen from the timing diagram illustrated in FIG. 5.

In the operation shown in FIG. 7, it is assumed that the first and second weights W0 and W1 are "110" and "011," respectively. In addition, it is assumed that the input voltage V0 corresponding to the first input data D0 is 500 mV and the input voltage V1 corresponding to the second input data D1 is 700 mV.

As shown in the timing diagram of FIG. 7, a phase 1 operation is performed between t0 and t1, a phase 2 operation is performed between t1 and t2, and a phase 3 operation is performed between t2 and t3.

Since an operation method of each phase is substantially the same as that described with reference to the timing diagram of FIG. 5, a description of the repeated part will be omitted.

In FIG. 7, VC0 corresponds to a voltage of the unit capacitor 114 included in the unit operation circuit 110, and VC1 corresponds to a voltage of a unit capacitor included in the unit operation circuit 120.

Hereinafter, VC0 may be referred to as a first voltage and VC1 may be referred to as a second voltage.

During the phase 1 operation, '0' which is the least significant bit W00 of the first weight W0 and '1' which is the least significant bit W10 of the second weight W1 are used.

Accordingly, at t01, the first voltage VC0 is set to 0V, and the second voltage VC1 is set to 700 mV, which is the second input voltage V1.

Thereafter, when the second switching signal S2 has the logic high level, charge redistribution is performed between the accumulation capacitor 150 and the unit capacitors included in the unit operation circuits 110 and 120.

Accordingly, the voltage VC of the accumulation capacitor 150, the first voltage VC0 of the unit capacitor 114 included in the unit operation circuit 110, and the second voltage VC1 of the unit capacitor included in the unit operation circuit 120 are equally set to 175 mV.

During the phase 2 operation, '1,' which is the middle bit W01 of the first weight W0, and '1,' which is the middle bit W11 of the second weight W1, are used.

Accordingly, at t11, the first voltage VC0 is set to 500 mV which is the first input voltage V0, and the second voltage VC1 is set to 700 mV which is the second input voltage V1.

Thereafter, when the second switching signal S2 has the logic high level, charge redistribution is performed between the accumulation capacitor 150 and the unit capacitors included in the unit operation circuits 110 and 120.

Accordingly, the voltage VC, the first voltage VC0, and the second voltage VC1 are equally set to 387.5 mV.

During the phase 3 operation, '1,' which is the most significant bit W02 of the first weight W0, and '0,' which is the most significant bit W12 of the second weight W1, are used.

Accordingly, at t21, the first voltage VC0 is set to 500 mV, which is the first input voltage V0, and the second voltage VC1 is set to 0V.

Thereafter, when the second switching signal S2 has the logic high level, charge redistribution is performed between the accumulation capacitor 150 and the unit capacitors included in the unit operation circuits 110 and 120.

Accordingly, the voltage VC, the first voltage VC0, and the second voltage VC1 are equally set to 318.75 mV.

When the number of word lines is M, that is, when each weight includes M bits, the charging voltage can be expressed as Equation 2, where M is a natural number.

$$VC = \sum_{i=0}^{M-1}\left(\frac{W0i}{2^{M+1-i}}V0 + \frac{W1i}{2^{M+1-i}}V1\right) \quad \text{(Equation 2)}$$
$$= \frac{1}{2^{M+1}}\sum_{i=0}^{M-1}\{(W0i \times 2^i)V0 + (W1i \times 2^i)V1\}$$
$$= \frac{1}{2^{M+1}}(W0 \times V0 + W1 \times V1)$$

When Equation 2 is generalized to a case in which the weight and the input data are vectors each having K elements, that is, when the number of bit lines BL is K, the charging voltage can be expressed as Equation 3, where K is a natural number.

$$VC = \frac{1}{K \times 2^M}\sum_{j=0}^{K-1} Wj \times Vj \quad \text{(Equation 3)}$$

Although various embodiments have been illustrated and described, various changes and modifications may be made to the described embodiments without departing from the spirit and scope of the invention as defined by the following claims.

What is claimed is:

1. A semiconductor device comprising:
    a memory cell array including a multiplicity of memory cells coupled between a plurality of word lines and one or more bit lines; and
    an operation circuit configured to perform a multiplication and accumulation (MAC) operation with one or more first multi-bit data provided from the one or more bit lines and one or more second multi-bit data,
    wherein a plurality of memory cells is coupled to each of the one or more bit lines, and the plurality of memory cells store a plurality of bits included in a corresponding one of the one or more first multi-bit data, and
    wherein the memory cell array sequentially provides the plurality of bits included in the corresponding first multi-bit data to the operation circuit,
    wherein the operation circuit includes:
        one or more unit operation circuits respectively corresponding to the one or more bit lines; and
        an accumulation capacitor,
        wherein each of the one or more unit operation circuits includes a unit capacitor selectively coupled to the accumulation capacitor for charge distribution.

2. The semiconductor device of claim 1, wherein each of the one or more unit operation circuits is configured to perform a first operation to discharge the unit capacitor included therein, a second operation to set a voltage of the unit capacitor as an input voltage, and a third operation to redistribute charges between the unit capacitor and the accumulation capacitor, the input voltage corresponding to one of the one or more second multi-bit data.

3. The semiconductor device of claim 2, wherein the unit capacitor is decoupled from the accumulation capacitor during the first operation and the second operation.

4. The semiconductor device of claim 1, wherein each of the one or more unit operation circuits includes:
    a digital-to-analog converter configured to convert corresponding second multi-bit data into an input voltage;
    a selection circuit configured to provide one of the input voltage and a ground voltage to a first terminal of a unit capacitor included therein according to a selection signal;
    a logic circuit configured to generate the selection signal according to a corresponding bit line voltage and a first switching signal;
    a first switch configured to couple a second terminal of the unit capacitor to the accumulation capacitor according to a second switching signal; and
    a second switch configured to couple the second terminal of the unit capacitor according to a third switching signal.

5. The semiconductor device of claim 4, further comprising a word line decoder configured to control the plurality of word lines so that a plurality of bits included in first multi-bit data are provided to the operation circuit.

6. The semiconductor device of claim 1, further comprising a bit line coupling circuit configured to couple the one or more bit lines with the operation circuit.

7. The semiconductor device of claim 1, further comprising one or more sense amplifiers each configured to sense and amplify a voltage of a corresponding bit line.

8. A semiconductor device comprising:
    a memory cell array including a multiplicity of memory cells coupled between a plurality of word lines and one or more bit lines; and
    an operation circuit configured to perform a multiplication and accumulation (MAC) operation with one or more first multi-bit data provided from the one or more bit lines and one or more second multi-bit data,
    wherein a plurality of memory cells is coupled to each of the one or more bit lines, and the plurality of memory cells store a plurality of bits included in a corresponding one of the one or more first multi-bit data,
    wherein the memory cell array sequentially provides the plurality of bits included in the corresponding first multi-bit data to the operation circuit,
    wherein the operation circuit includes one or more unit operation circuits respectively corresponding to the one or more bit lines, and
    wherein each of the one or more unit operation circuits includes a unit capacitor and a unit accumulation capacitor selectively coupled to the unit capacitor for charge redistribution.

9. The semiconductor device of claim 8, wherein the operation circuit includes a coupling switch coupling unit accumulation capacitors included in two adjacent unit operation circuits among the one or more unit operation circuits.

* * * * *